United States Patent [19]

Weber et al.

[11] Patent Number: 5,591,485

[45] Date of Patent: Jan. 7, 1997

[54] METHOD AND APPARATUS FOR PRODUCING NICKEL SHELL MOLDS

[76] Inventors: Reinhart Weber, Highway 12 - P.O. Box 399, Midland, Ontario, Canada, L4R 4L1; Robert E. Sheppard, 14 Rei Court, Midland, Ontario, Canada, L4R 4L9

[21] Appl. No.: 422,402

[22] Filed: Apr. 14, 1995

Related U.S. Application Data

[62] Division of Ser. No. 238,282, May 5, 1994, Pat. No. 5,407,487.

[30] Foreign Application Priority Data

May 5, 1993 [GB] United Kingdom ............... 93092492

[51] Int. Cl.[6] .................................................. C23C 16/06
[52] U.S. Cl. ..................... 427/250; 427/248.1; 427/252; 118/724; 118/728; 249/80
[58] Field of Search ......................... 427/248.1, 124, 427/229, 252, 250; 118/728, 724, 719, 715; 249/80

[56] References Cited

U.S. PATENT DOCUMENTS

| 2,317,597 | 4/1943 | Ford et al. ........................ 425/407 |
| 2,579,898 | 12/1951 | Brucker ............................... 249/80 |
| 2,907,070 | 10/1959 | Van Hartesveldt ............... 425/384 |
| 3,638,299 | 2/1972 | Garner et al. .................. 29/527.2 |
| 4,063,705 | 12/1977 | Vodra .................................. 249/80 |
| 4,659,056 | 4/1987 | Michaud-Soret .................. 249/78 |
| 5,169,549 | 4/1995 | Weber et al. ..................... 118/728 |

*Primary Examiner*—Shrive Beck
*Assistant Examiner*—Timothy H. Meeks
*Attorney, Agent, or Firm*—Arne I. Fors; D. Doak Horne; Jeffrey T. Imai

[57] ABSTRACT

A method and apparatus for producing a nickel shell mold by nickel vapour deposition onto a mandrel in a deposition chamber is disclosed. A nickel shell mold assembly is produced having a liquid and vapour-tight cavity co-extensive with the mandrel for receiving a heating fluid, preferably a liquid such as oil, for flood heating of the mandrel to a uniform surface temperature.

4 Claims, 6 Drawing Sheets

METHOD AND APPARATUS FOR PRODUCING NICKEL SHELL MOLDS

This application is a division of application Ser. No. 08/238,282, filed May 5, 1994, now U.S. Pat. No. 5,407,487.

BACKGROUND OF THE INVENTION

This invention relates to a nickel vapour deposition method of producing nickel shell molds and, more particularly, relates to a flood heating system for mandrels used in the nickel vapour deposition process.

The production of nickel molds by nickel vapour deposition is known. Nickel vapour in the form of nickel carbonyl gas is passed over a heated mandrel in a deposition chamber and, as the nickel carbonyl gas contacts the hot mandrel surface, it decomposes to form a hard and dense nickel deposit. Uniform heat transfer from the mandrel surface is required to achieve an even deposition of nickel on the surface of the mandrel.

The standard method of heating the mandrel employs hot spray jets directed at the underside of the mandrel. It has been found that the spray jet method creates hot and cold spots causing uneven heat transfer, hence uneven deposition of nickel on the upper surface of the mandrel.

U.S. Pat. No. 5,169,549 issued Dec. 8, 1992 shows a nickel shell mold formed by nickel vapour deposition onto a mandrel. The nickel shell mold is comprised of a combination steel parting line and manifold with a plurality of heating and cooling lines connected to the manifold, all of which are encapsulated within a nickel shell.

SUMMARY OF THE INVENTION

It is a principal object of the present invention to provide a method and an apparatus for uniformly heating a mandrel for nickel vapour deposition.

In its broad aspect, the method of the invention for deposition of a metal such as nickel onto a mandrel surface in a deposition chamber comprises enclosing a side of the mandrel opposite the said surface to form a cavity substantially co-extensive with the mandrel, flooding the said cavity with a heating fluid whereby air is substantially discharged from the cavity, and uniformly heating said heating fluid in the cavity to a desired temperature for uniform heating of the mandrel surface in the deposition chamber. In a preferred embodiment, a continuous or intermittent steel or metal alloy insert such as a parting line insert, pad, bushing or the like is attached to the mandrel about its perimeter on the mandrel surface within the deposition chamber, the heating fluid is a liquid, the cavity is flooded by feeding the liquid to the cavity under gravity or pump pressure, and substantially all the air is vented from the cavity whereby the heating liquid is in substantial contact with the mandrel.

The mandrel assembly of the invention, in its broad aspect, for use in vapour deposition of a metal such as nickel thereon, comprises a mandrel having a desired surface configuration on a side thereof, a base co-extensive with the mandrel and spaced from the mandrel for forming a closed, liquid-tight cavity of which said mandrel forms a wall, means for flooding said cavity with a heating fluid, and means for heating said heating fluid to a desired temperature, whereby said mandrel can be heated to a uniform surface temperature. In a preferred embodiment, said metal is nickel deposited from nickel carbonyl vapour. A continuous or intermittent steel or like reinforcing metal alloy is attached to the mandrel about its perimeter on the side having the desired surface configuration. The heating fluid is a liquid such as oil and said means for flooding said cavity with a heating fluid may comprise a low-pressure pump or a gravity fill and expansion tank containing the liquid elevated at a height above the cavity, conduit means communicating said pump or tank to the cavity for feeding the liquid under pressure to the cavity, and vent means positioned in an upper portion of the cavity for substantial discharge of air from the cavity upon flooding of the chamber with the liquid.

The means for heating the heating fluid may comprise at least one electrical immersion element in contact with the heating fluid in the cavity, at least one heating pipe positioned within the cavity in contact with the heating fluid, or a heating plate forming the base of the cavity for heating the fluid by conduction and convection. The mandrel is formed of a thermally conductive material such as aluminum, brass, steel, stainless steel, copper, high temperature resin and glass fibre-reinforced epoxy resin.

BRIEF DESCRIPTION OF THE DRAWINGS

The method of nickel shell mold production of the present invention will be described with reference to the accompanying drawings, in which.

DESCRIPTION OF THE PREFERRED EMBODIMENTS

Figure 1:
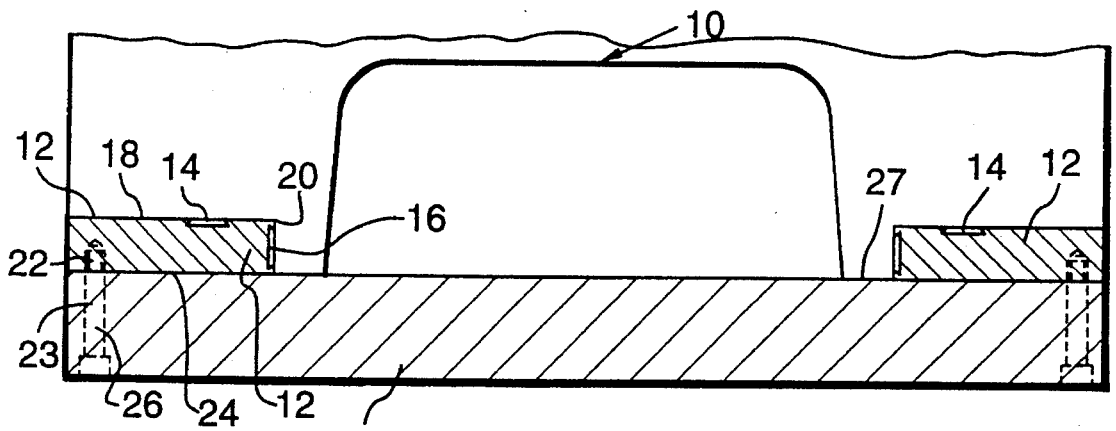
FIG. 1 is a section view of a model, to be reproduced, placed on a base plate, having about it's perimeter a steel parting line insert placed in close proximity thereto.

FIG. 1 illustrates a model 10, which is to be duplicated in mass production by a molding technique, such as by injection or blow molding. About the perimeter and at a close proximity to the model 10 is a continuous or intermittent steel parting line insert 12, having dovetail grooves 14 and 16, formed on the upper surface 18 and inside wall 20, respectively. A plurality of threaded holes 22 are provided in the steel parting line insert 12, with matching holes 23 in base plate 28, for attachment with bolts, not shown, of parting line insert 12 onto plate 28 on which the model 10 is sitting.

Figure 2:
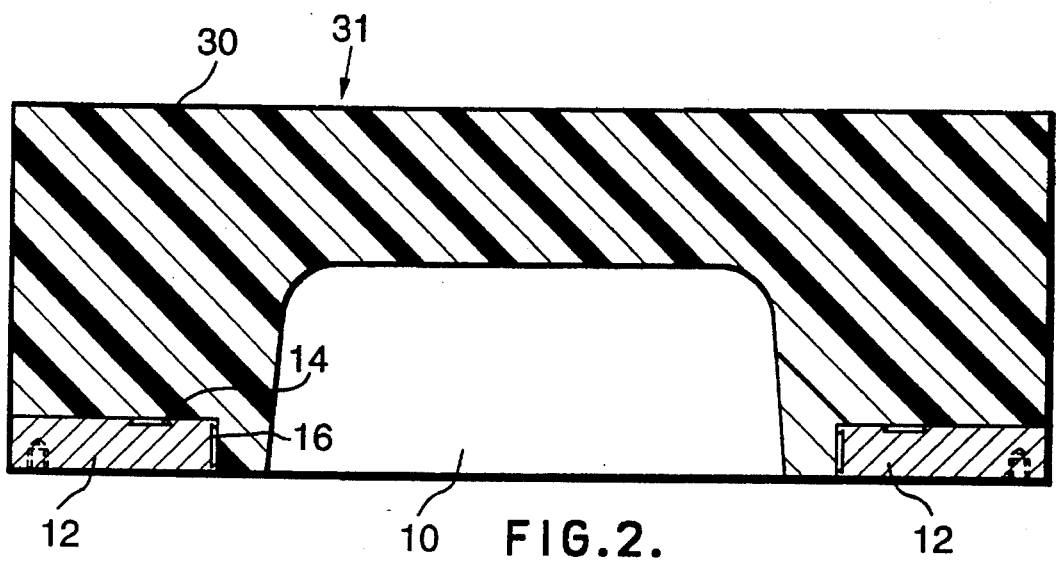
FIG. 2 is a section view of a cast of the model of FIG. 1, attached to a steel parting line insert.

Referring to FIG. 2, solid casting material 30 or a skin cast such as formed from an epoxy resin or plaster of paris is formed about the model 10 and steel parting line insert 12. Attachment of the casting material to dovetail grooves 14 and 16 in steel parting line insert 12 is avoided by filling the grooves with putty. After the casting material 30 hardens, the base plate 28 and the model 10 are removed, leaving a cast 31 of the model 10 connected at its periphery to the steel parting line insert 12.

Figure 3:
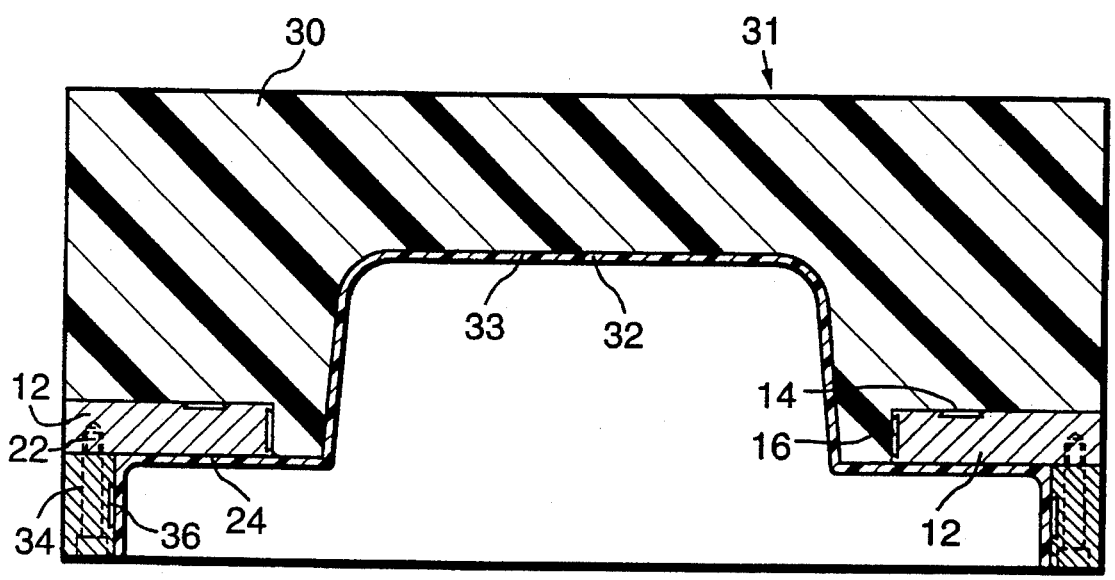
FIG. 3 is a section view of a mandrel, integrally connected to an outer steel frame, formed of a composite laminate laid up in the cavity of the cast of the model of FIG. 2.

In FIG. 3, a mandrel 32 is shown, formed from a composite laminate such as epoxy resin reinforced with glass fibre. The mandrel may also be made from aluminum, brass, steel, stainless steel, copper, high temperature resin or any other thermally conductive material which will not outgas at temperatures over 150° C. The threaded holes 22, in the steel parting line insert 12, are now used to secure a preferably continuous outer steel frame 34 to the steel parting line insert 12 about its periphery. The composite laminate is laid up in the cavity 33 of the model cast 31 and extends outwardly along the lower planar surface 24 of the steel parting line insert 12 to abut and flange the steel frame 34. The laminate is secured in place to frame 34 by bonding to the steel and by dovetail grooves 36 in the inner wall of said steel frame 34.

Upon hardening of the mandrel 32, the cast 31 is removed from the mandrel 32 and steel parting line insert 12. The surface of the mandrel 32 and the parting line insert 12, including the dovetail grooves 14 and 16, must then be thoroughly cleaned to ensure no hydrocarbons, particulates or the like are on the surfaces.

Figure 4:
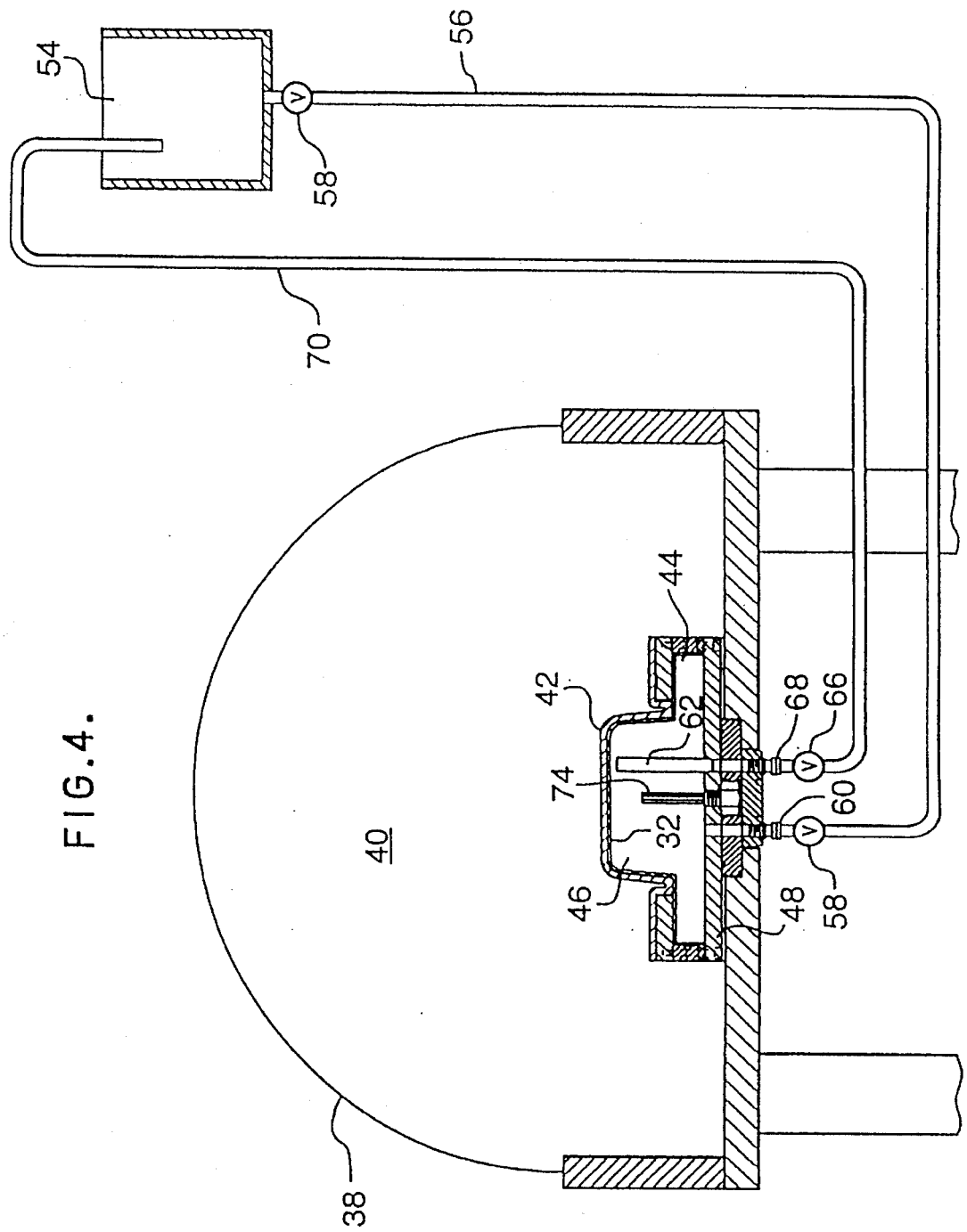
FIG. 4 is a section view of the nickel vapour deposition apparatus of the invention showing an embodiment of oil filling and heating apparatus.
Figure 5:
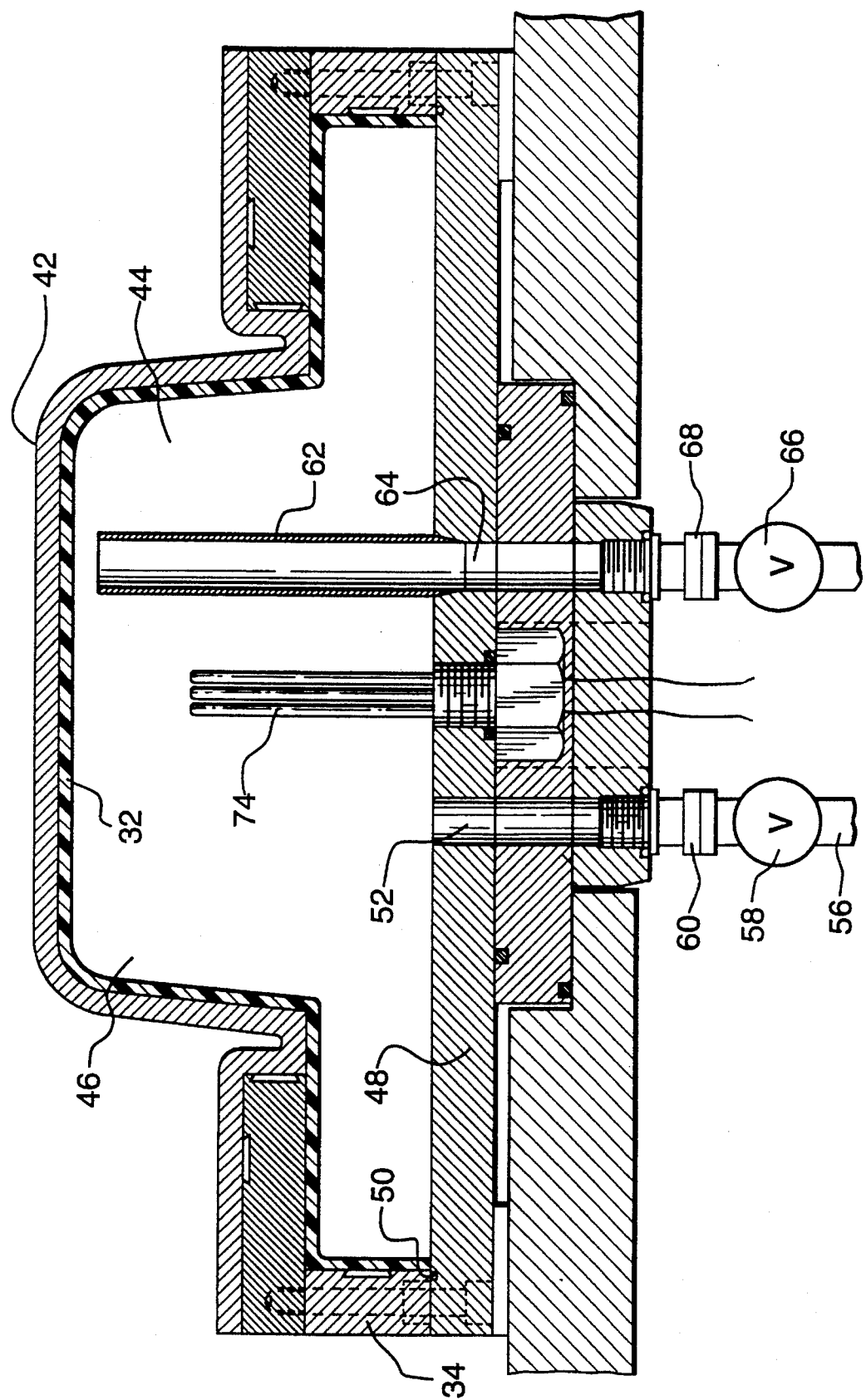
FIG. 5 is an enlarged section view of the mandrel of FIG. 4 showing the heating apparatus in more detail.

Referring now to FIGS. 4 and 5, nickel shell 42 is formed by nickel vapour deposition. The mandrel 32 is heated and subjected to a nickel carbonyl vapour environment 40 within a deposition chamber depicted by numeral 38. As the vapour comes in contact with the hot mandrel surface it decomposes, depositing nickel on the mandrel surface on an atomic scale. Uniform heat is applied to the mandrel 32 by a hot heat transfer fluid 44, within the mandrel cavity 46.

As shown more clearly in FIG. 5, the heat transfer fluid 44 is contained within the mandrel cavity 46 by securing the outer steel frame 34 to a mandrel base 48, having an 'O' ring seal 50 or flange gasket to provide a leak-proof closed cavity 46. The seal must be suitable for high temperature service, i.e. over 150° C., and must be impermeable to heating fluids and nickel carbonyl vapour.

The mandrel cavity 46 is filled through an entry port 52 in the mandrel base 48 with oil or other suitable heat transfer fluid 44 by gravity feed with an adequate head to sustain flow from a fill and expansion tank 54, via a hose 56 having a shut off valve 58 at each end. Hose 56 thus is operatively connected at one end to said oil fill and expansion tank 54 and at the other end to a quick disconnect coupler 60, which is in communication with the entry port 52 in the mandrel base 48. The heat transfer fluid can also be fed to cavity 46 by a low-pressure pump, not shown.

It is imperative that all air is removed from the mandrel cavity 46 to obtain a continuous heat transfer medium and thus a vertical vent pipe 62, operatively connected to an exhaust port 64 in the mandrel base 48, extends substantially to the top of the mandrel cavity 46 to release air as the heat transfer fluid 44 is introduced to said mandrel cavity 46. Discharged air, from the vent pipe 62, passes through a shut off valve 66 connected to the exhaust port 64 by a quick disconnect coupler 68, and is vented via a vent line 70.

After all air is evacuated from the mandrel cavity 46, the heat transfer fluid 44 is heated, causing it to expand. The shut-off valve 66 can be shut while the filler line valve 58 remains open to allow a portion of the expanding heat transfer fluid 44 to escape to the oil fill and expansion tank 54. Detrimental deformation of the mandrel 32 could result if expansion pressure is not released at this stage.

Heating of the mandrel is accomplished by a flood heating method, in which a heat source such as an electrical immersion oil heater 74, extending upwardly from the mandrel base 48, is employed to heat the heat transfer fluid to the desired temperature. The hot heat transfer fluid 44 provides a uniform mandrel surface temperature to allow even and consistent deposition of nickel thereon.

Figure 6:
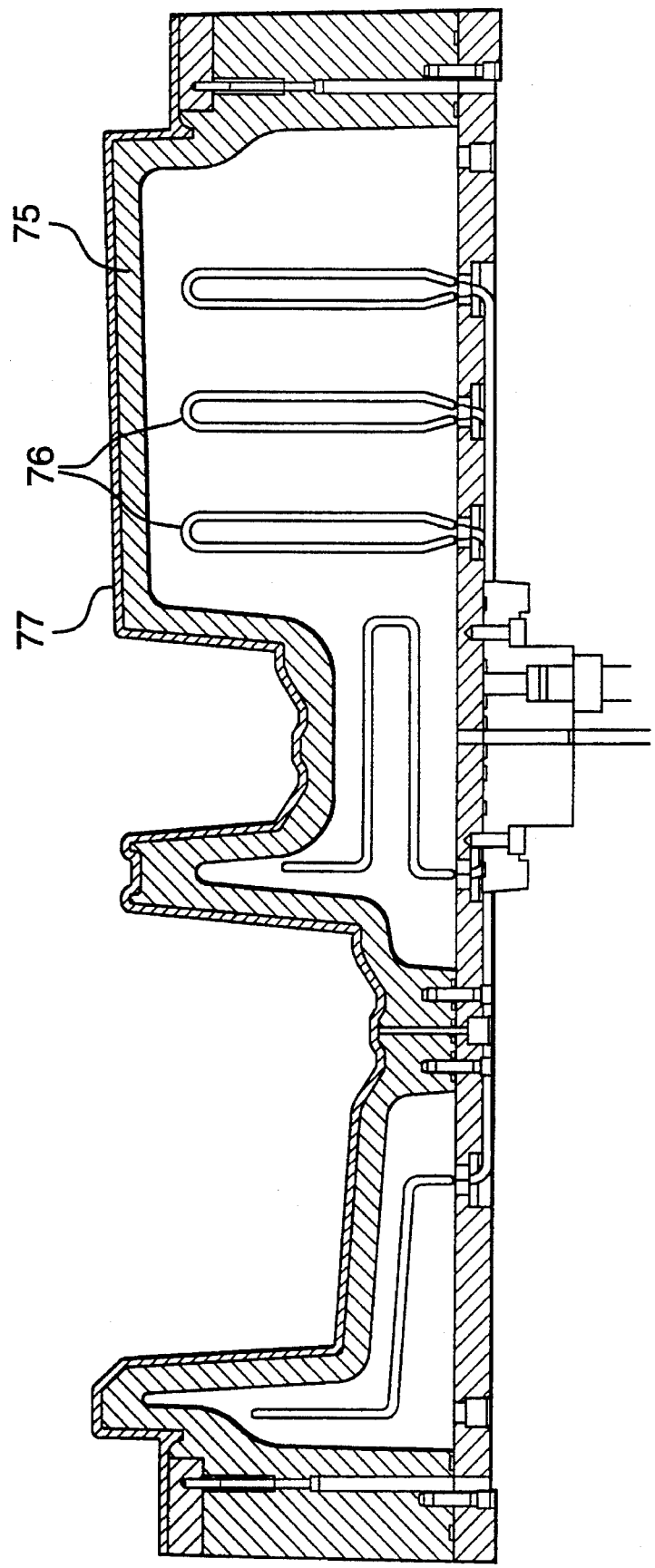
FIG. 6 is a section view of another heating apparatus embodiment of the invention employing a plurality of electric heating elements.

Referring now to FIG. 6, a mandrel 75 having a complex shape is shown with a nickel deposition 77 thereon. For a complex mandrel shape or a large mandrel where a single heating element is inadequate, a plurality of electrical heat elements 76 can be used to heat the transfer fluid to maintain a uniform mandrel temperature. The mandrel 75 may be formed of a metal casting such as an aluminum casting, using conventional pattern making and casting technology.

Figure 7:
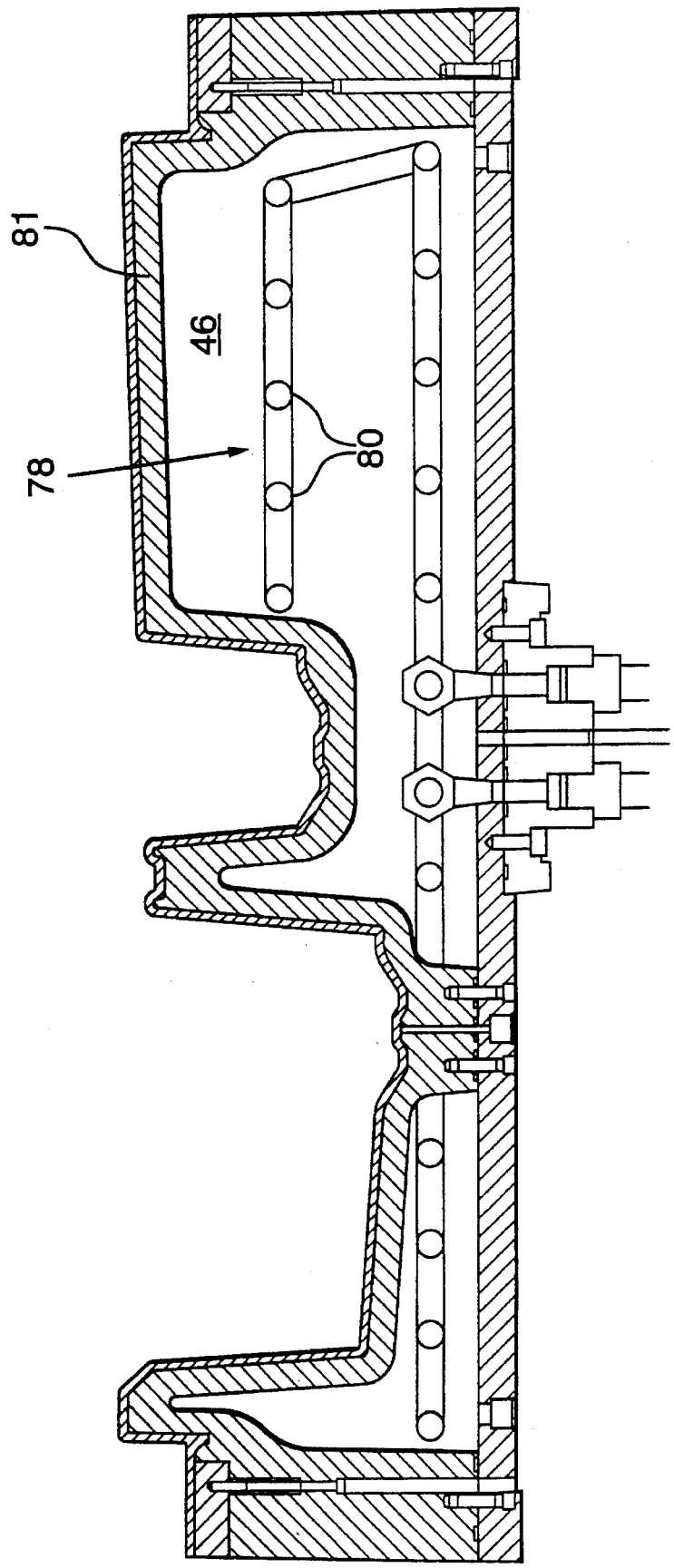
FIG. 7 is a section view of a further heating apparatus embodiment employing a fluid heat exchange circuit.

FIG. 7 shows a complex mandrel configuration with a further heat apparatus embodiment in which the heat transfer fluid in the mandrel cavity 46 is heated by a heat exchanger system 78. In this embodiment, hot fluid such as heated oil or steam is pumped through pipes 80 positioned within the heat transfer fluid to provide a uniform temperature to the heat transfer fluid and to the mandrel 81.

Figure 8:
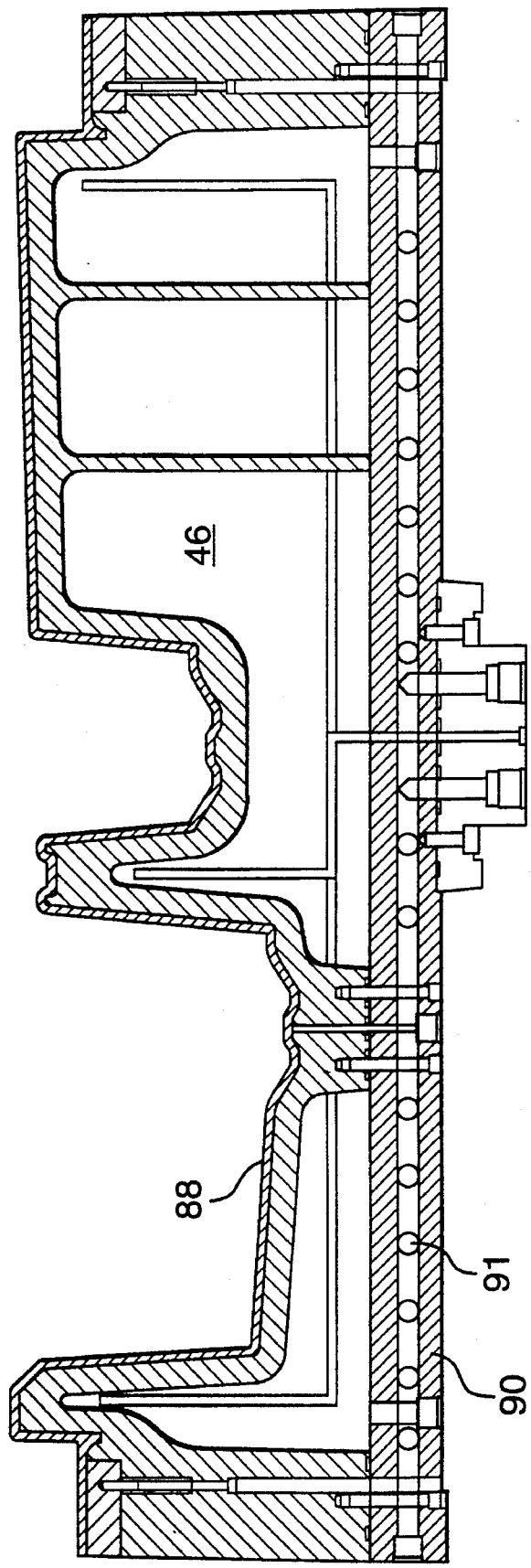
FIG. 8 is a section view of yet another heating apparatus embodiment employing a hot plate.

FIG. 8 shows a mandrel 88 with a complex configuration with another heat apparatus embodiment in which the heat transfer fluid in the mandrel cavity 46 is heated by hot plate 90, in which hot fluid such as heated oil or steam is pumped through conduits 91 drilled into the plate forming a continuous circuit. Heat is transferred from the plate 90 to the fluid in the cavity 46 by conduction and convection and then uniformly transferred to the mandrel surface.

The present invention provides a number of important advantages. The encapsulation of a continuous steel parting line insert imparts structural rigidity and dimensional stability to the nickel shell mold. The incorporation of metal inserts facilitates the mounting of discrete hardware components such as mounting bushings, precision tools and the like. The heating of the mandrel by flood heating with a fluid medium, preferably a liquid, imparts a uniform temperature to the mandrel surface for an even nickel shell thickness. It will be understood, of course, that modifications can be made in the embodiments of the invention illustrated herein without departing from the scope and purview of the invention as defined by the appended claims.

I claim:

1. A method of nickel vapour deposition on a surface of a mandrel positioned in a deposition chamber comprising enclosing a side of the mandrel opposite the said surface to form a cavity substantially co-extensive with the mandrel, flooding the said cavity with a heating fluid, substantially discharging air from the cavity, uniformly heating said heating fluid in the cavity to a desired temperature for uniform heating of the mandrel surface in the deposition chamber and depositing nickel from nickel vapor onto said heated mandrel surface.

2. A method as claimed in claim 1, additionally comprising attaching a continuous or intermittent steel or metal alloy insert to the mandrel about the mandrel perimeter onto said surface.

3. A method as claimed in claim 2, in which said steel or metal alloy insert is selected from the group consisting of a steel parting line insert, a steel pad and a steel bushing.

4. A method as claimed in claim 1, in which said heating fluid is a liquid and said cavity is flooded by feeding the liquid to the cavity under pressure, wherein substantially all the air is vented from the cavity and the liquid is in substantial contact with the mandrel.

* * * * *